United States Patent
DeHon et al.

(10) Patent No.: US 7,210,112 B2
(45) Date of Patent: Apr. 24, 2007

(54) ELEMENT PLACEMENT METHOD AND APPARATUS

(75) Inventors: André DeHon, Pasadena, CA (US); Michael Wrighton, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 397 days.

(21) Appl. No.: 10/643,772

(22) Filed: Aug. 18, 2003

(65) Prior Publication Data

US 2004/0139413 A1    Jul. 15, 2004

Related U.S. Application Data

(60) Provisional application No. 60/473,722, filed on May 28, 2003, provisional application No. 60/416,080, filed on Oct. 4, 2002, provisional application No. 60/405,112, filed on Aug. 21, 2002.

(51) Int. Cl.
   *G06F 17/50* (2006.01)
(52) U.S. Cl. .................................... 716/9
(58) Field of Classification Search ............. None
   See application file for complete search history.

(56) References Cited

U.S. PATENT DOCUMENTS

| | | | | |
|---|---|---|---|---|
| 3,654,615 | A | 4/1972 | Freitag | 340/172.5 |
| 5,144,563 | A | 9/1992 | Date et al. | 364/491 |
| 5,200,908 | A * | 4/1993 | Date et al. | 716/10 |
| 5,465,218 | A * | 11/1995 | Handa | 716/8 |
| 5,495,419 | A | 2/1996 | Rostoker et al. | 364/468 |
| 5,638,292 | A * | 6/1997 | Ueda | 716/8 |
| 5,796,625 | A | 8/1998 | Scepanovic et al. | 364/491 |
| 5,815,403 | A * | 9/1998 | Jones et al. | 716/9 |
| 6,080,204 | A * | 6/2000 | Mendel | 716/7 |
| 6,155,725 | A * | 12/2000 | Scepanovic et al. | 716/9 |
| 6,243,851 | B1 | 6/2001 | Hwang et al. | 716/10 |
| 6,292,929 | B2 * | 9/2001 | Scepanovic et al. | 716/14 |
| 2003/0174723 | A1 | 9/2003 | DeHon et al. | 370/404 |
| 2005/0063373 | A1 | 3/2005 | DeHon et al. | 370/380 |

FOREIGN PATENT DOCUMENTS

WO    98/35294    8/1998

OTHER PUBLICATIONS

Alfke, P., "Efficient Shift Registers, LFSR Counters, and Long Psuedo-Random Sequence Generators," *Xilinx Application Note*, KAPP 052, INTERNET: <http://www.xilinx.com/xapp/xapp203.pdf> pp. 1-6 (Jul. 7, 1996).

(Continued)

Primary Examiner—Leigh M. Garbowski
(74) Attorney, Agent, or Firm—Ladas & Parry LLP

(57) ABSTRACT

A method and a device for performing placement of a plurality of elements for circuit design. A potential location is assigned to each element and a placement engine is assigned to each potential location. Pairing operations are performed, in parallel, between placement engines to determine whether to perform exchange of the elements associated with the engines. Exchange determination is based both on a cost function and on randomness considerations. Also self-placement is allowed, where the placement engines are implemented on the same hardware system on which the elements are to be placed.

38 Claims, 11 Drawing Sheets

OTHER PUBLICATIONS

Banerjee, P., *Parallel Algorithms for VLSI Computer-Aided Design*, Chapter 3, Englewood Cliffs, New Jersey: PTR Prentice Hall, pp. 118-171 (1994).

Betz, V., et al., *Architecture and CAD for Deep-Submicron FPGAs*, Boston: Kluwer Acadmeic Publishers, pp. 50-61 (1999).

Brelet, J., "An Overview of Multiple CAM Designs in Virtex Family Devices," *Xilinx Application Note*, XAPP201, INTERNET: <http://www.xilinx.com/xapp/xapp260.pdf> pp. 1-6 (Sep. 23, 1999).

Brelet, J., et al., "Designing Flexible, Fast CAMs with Virtex Family FPGAs," *Xilinx Application Note*, XAPP03, INTERNET: <http://www.xilinx.com/xapp/xapp203.pdf> pp. 1-17 (Sep. 23, 1999).

Caspi, E., et al., "Stream Computations Organized for Reconfigurable Execution (SCORE): Introduction and Tutorial," presented *at the Tenth International Conference on Field Programmable Logic and Applications*, Villach, Austria, INTERNET: <http://www.cs.berkeley.edu/projects/brass/documents/score_tutorial.html> 31 pages total (Aug. 25, 2000).

Chan, Pak K., et al., "Parallel Placement for Field-Programmable Gate Arrays," *presented at the Eleventh ACM International Symposium on Field-Programmable Gate Arrays*, Monterey, California, pp. 43-50 (2003).

Chyan, Dah-Jun, et al., "A Placement Algorithm for Array Processors," *presented at the ACM/IEEE Design Automation Conference*, Miami Beach, Florida, INTERNET: <http://portal.acm.org/citation.cfm?id=800661> pp. 182-188 (1983).

Compton, K., et al., "Reconfigurable Computing: A Survey of Systems and Software," *ACM Computing Surveys (CSUR)*, vol. 34, No. 2, INTERNET:<http://doi.acm.org/10.1145/508352.50353> pp. 171-210 (Jun. 2002).

DeHon, A., et al., "Hardware-Assisted Fast Routing," *IEEE Symposium on Field-Programmable Custom Computing Machines*, Napa Valley, California, INTERNET: <http:www.cs.caltech.edu/research/ic/abstracts/fastroute_feem2002.html> pp. 1-11 (Apr. 22-24, 2002).

Goto, S., An Efficient Algorithm for the Two-Dimensional Placement Problem in Electrical Circuit Design, *IEEE Transactions on Circuits and Systems*, vol. CAS-28, No. 1, pp. 12-18 (Jan. 1981).

Haldar, M., et al., "Parallel Algorithms for PPGA Placement," *Proceedings of the Tenth Great Lakes Symposium on VLSI*, INTERNET: <http://doi.acm.org/10.1145/330855.330988> pp. 86-94 (2000).

Huang, R., et al., "Stochastic, Spatial Routing for Hypergraphs, Trees, and Meshes," *Eleventh ACM International Symposium on Field-Programmable Gate Arrays*, INTERNET:<http://www.cs.caltech.edu/research/ic/abstracts/fastroute_fpga2003.html> 12 pages total (Feb. 23-25, 2003).

Kirkpatrick, S., et al., "Optimization by Stimulated Annealing," *Science*, vol. 220, No. 4598, pp. 671-680 (May 13, 1983).

Kravitz, S.A. et al., "Multiprocessor-Based Placement by Stimulated Annealing," *presented at the Twenty-Third IEEE Design Automation Conference*, Las Vegas, Nevada INTERNET: <http://doi.acm.org/10.1145/318013.318104> pp. 567-573 (1986).

Mulpuri, C., et al., "Runtime and Quality Tradeoffs in FPGA Placement and Routing," *Proceedings of the Ninth International Symposium on Field-Programmable Gate Arrays*, INTERNET:<http://www.ee.washington.edu/faculty/hauck/publications/RuntimeTradeoffs.pdf> pp. 29-36 (Feb. 11-13, 2001).

Sankar, Y., et al., "Trading Quality for Compile Time: Ultra-Fast Placement for FPGAs," *Proceedings of the 1999 ACM/SIGDA Seventh International Symposium on Field Programmable Gate Arrays*, INTERNET:<http://www.eecg.toronto.edu/~jayar/pubs/sankar/fpga99sankar.pdf> pp. 157-166 (1999).

Schnorr, C.P., et al., "An Optimal Sorting Algorithm For Mesh Connected Computers," *presented at the Eighteenth Annual ACM Symposium on Theory of Computing*, Berkeley, CA, INTERNET: <http://doi.acm.org/10.1145/359461.359481> pp. 255-270 (1986).

Shahookar, K., et al., "VSLI Cell Placement Techniques," *ACM Computing Surveys (CSUR)*, vol. 23, No. 2, pp. 143-220 (Jun. 1991).

Spira, P., et al., "Hardware Acceleration of Gate Array Layout," *presented at the 22nd ACM/IEEE Design Automation Conference*, Las Vegas, Nevada, INTERNET: <http://doi.acm.org/10.1145/317825.317913> pp. 359-366 (1985).

Tessier, R., "Fast Placement Approaches for FPGAs," *ACM Transactions on Design Automation of Electronic Systems (TODAES)*, vol. 7, No. 2 pp. 284-305, (Apr. 2002).

Thompson, C.D., et al., "Sorting on a Mesh-Connected Parallel Computer," *Communications of the ACM*, vol. 20, No. 4, pp. 263-271 (Apr. 1977).

Arora, S., et al., "On-Line Algorithms For Path Selection In A Nonblocking Network," *SIAM Journal on Computing*, vol. 25, No. 3, pp. 1-25 (Jun. 1996).

Banerjee, P., et al., "A Parallel Simulated Annealing Algorithm for Standard Cell Placement on a Hypercube Computer," *IEEE International Conference on Computer-Aided Design*, pp. 34-37 (1986).

Banerjee, P., et al., "Parallel Simulated Annealing Algorithms for Cell Placement on Hypercube Multiprocessors," *IEEE Transactions on Parallel and Distributed Systems*, vol. 1, No. 1, pp. 91-106 (1990).

Bhatt, S.N., et al., "A Framework for Solving VLSI Graph Layout Problems," *Journal of Computer and System Sciences*, vol. 28, pp. 300-345 (1984).

Chan, P.K., et al., "Acceleration of an FPGA Router," *Proceedings of the IEEE Symposium on FPGAs for Custom Computing Machines, IEEE*, pp. 175-181 (Apr. 1997).

Chan, P.K., et al., "New Parallelization and Convergence Results for NC: A Negotiation-Based FPGA Router," *Proceedings of the 2000 International Symposium on Field-Programmable Gate Arrays (FPGA '00), ACM/SIGDA*, pp. 165-174 (Feb. 2000).

Chong, F., et al., "METRO: A Router Architecture for High-Performance, Short-Haul Routing Networks," *Proceedings of the Annual International Symposium on Computer Architecture, Chicago, IEEE*, vol. SYMP. 21, pp. 266-277 (Apr. 18-21, 1994).

Dally, W.J., "Express Cubes: Improving the Performance of $k$-ary $n$-cube Interconnection Networks," *IEEE Transactions on Computers*, vol. 40, No. 9, pp. 1016-1023 (Sep. 1991).

DeHon, A., "Balancing Interconnection and Computation in a Reconfigurable Computing Array (or why you don't really want 100% LUT utilization)," *Proceedings of the 1999 ACM/SGDA Seventh International Symposium on Field Programmable Gate Arrays*, pp. 1-10 (Feb. 21-23, 1999).

DeHon, A., "Compact, Multilayer Layout for Butterfly Fat-Tree," *Proceedings of the Twelfth ACM Symposium on Parallel Algorithms and Architectures*, 10 pages total (Jul. 2000).

DeHon, A., "Entropy, Counting and Programmable Interconnect," *FPGA'96, ACM-SIGDA Fourth International Symposium on FPGAs*, Monterey CA, Fig. 2, 7 pages total (Feb. 11-13, 1996).

DeHon, A., "Rent's Rule Based Switching Requirements, System Level Interconnect Prediction," *SLIP 2001*, pp. 197-204 (Mar. 31-Apr. 1, 2001).

Erényi, I., et al., "FPGA-based Fine Grain Processor Array Design Considerations," *Proceedings of the Third IEEE International Conference*, pp. 659-662 (1996).

Fiduccia, C.M., et al., "A Linear-Time Heuristic for Improving Network Partitions," *19th Design Automation Conference*, Paper 13.1, pp. 175-181 (1982).

Greenberg, R.I., et al., "A Compact Layout for the Three-Dimensional Tree of Meshes," *Appl. Math. Lett.*, vol. 1, No. 2, pp. 171-176 (1988).

Greenberg, R.I., et al., "Randomized Routing on Fat-Trees," *Laboratory for Computer Science, Massachusetts Institute of Technology*, Cambridge, Massachusetts, pp. 1-23 (Jun. 13, 1996).

Henry, D.S., et al., "Cyclic Segmented Parallel Prefix," *Ultrascalar Memo 1*, Yale, pp. 1-14 (Nov. 1998).

Horvath, E.I, "A Parallel Force Direct Based VLSI Standard Cell Placement Algorithm," *Proceedings of the International Symposium on Circuits and Systems*, vol. 2, pp. 2071-2074 (1993).

Iosupovici, A., "A Class of Array Architectures for Hardware Grid Routers," *IEEE Transactions on Computer-Aided Design of Integrated Circuits and Systems*, vol. CAD-5, No. 2, pp. 245-255 (Apr. 1986).

Kernighan, B.W., et al., "An Efficient Heuristic Procedure for Partitioning Graphs," *Bell Syst. Tech. J.*, vol. 49, No. 2, pp. 76-80 (Feb. 1970).

Landman, B.S., et al., "On Pin Versus Block Relationship for Partitions of Logic Graphs," *IEEE Transactions on Computers*, vol. C-20, No. 12, pp. 1469-1479 (1971).

Leiserson, C.E., "Fat Trees: Universal Networks for Hardware-Efficient Supercomputing," *IEEE Transactions on Computers*, vol. C-34, No. 10, pp. 892-901 (Oct. 1985).

McMurchie, L., et al., "PathFinder: A Negotiation-Based Performance-Driven Router for FPGAs," *Proceedings of the ACM/SIGDA International Symposium on Field-Programmable Gate Arrays, ACM*, pp. 111-117 (Feb. 1995).

"METIS: Family of Multilevel Partitioning Algorithms," INTERNET: <http://www-users.cs.umn.edu/~karypis/metis/index.html> 1 page total (Retrieved on Feb. 4, 2005).

Ryan, T., et al., "An ISMA Lee Router Accelerator," *IEEE Design and Test of Computers*, pp. 38-45 (Oct. 1987).

Sai-Halasz, G.A., "Performance Trends in High-End Processors," *Proceedings of the IEEE*, vol. 83, No. 1, pp. 20-36 (Jan. 1995).

"SS7 Tutorial," *Performance Technologies*, INTERNET: <http://www.pt.com/tutorials/ss7> pp. 1-23 (Aug. 22, 2001).

Swartz, J.S., et al., "A Fast Routability-Driven Router for FPGAs," *Proceedings of the 1998 International Symposium on Field-Programmable Gate Arrays (FPGA '98)*, pp. 140-149 (Feb. 1998).

Tessier, R., "Negotiated A$^+$ Routing for FPGAs," *Proceedings of the 5th Canadian Workshop on Field Programmable Devices*, 6 pages total (Jun. 1998).

Thompson, C.D., "Area-Time Complexity for VLSI," *Eleventh Annual ACM Symposium on Theory of Computing*, pp. 81-88 (May 1979).

Togawa, N., et al., "An Incremental Placement and Global Routing Algorithm for Field-Programmable Gate Arrays," *Design Automation Conference*, pp. 519-526 (1998).

Togawa, N., et al., "Maple: A Simultaneous Technology Mapping, Placement, and Global Routing Algorithm for Field-Programmable Gate Arrays," *IEEE/ACM International Conference on Computer-Aided Design*, pp. 156-163 (1994).

Tsu, W., et al., "HSRA: High-Speed, Hierarchical Synchronous Reconfigurable Array," *Proceedings of the International Symposium on Field Programmable Gate Arrays*, pp. 1-10 (Feb. 1999).

Wu, Yu-Liang, et al., "Graph-Based Analysis of 2-D FPGA Routing," *IEEE Transactions on Computer-Aided Design of Integrated Circuits and Systems*, vol. 15, No. 1, pp. 33-44 (Jan. 1996).

\* cited by examiner

```
if hypotheticalCost < currentCost then
    return TRUE;
else
    return FALSE;
```

FIG. 5

```
P ← UPDATEP();
if RANDOM() < P then
    return TRUE;
else if hypotheticalCost <
        currentCost then
    return TRUE;
else
    return FALSE;
```

FIG. 6

```
if P undefined then
    P ← 1;
P ← P - 1/(4×TOTALINTERVALSTORUN)
return P
```

FIG. 7

```
randomly place the design into the PE array
for interval in 0 to TOTALINTERVALSTORUN
   for each node PE do in paralell
        PE.SHIFTOUTCURRENTPOSITION();
        loop NUMBEROFCELLS times do
            PE.SHIFTPOSITIONCHAIN();
            UPDATE PE.connectedCell.positions;
        loop SWAPSPERINTERVAL times do
            for four phases do
              PE.SWAPIFAPPROPRIATE();
return the placement stored in the PE array
```

ELEMENT PLACEMENT METHOD AND APPARATUS

CROSS REFERENCE TO RELATED APPLICATIONS

This application claims the benefit of U.S. provisional Patent Application Ser No. 60/405,112 filed on Aug. 21, 2002 for a "Method and Apparatus for Hardware Acceleration of the Placement Problem" by André DeHon and Michael Wrighton, U.S. provisional Patent Application Ser. No. 60/416,080 filed on Oct. 4, 2002 filed by Michael Wrighton and André DeHon for "Hardware-assisted simulated annealing with application for fast FPGA Placement" and U.S. provisional Patent Application Ser. No. 60/473,722 filed on May 28, 2003 by Michael Wrighton for "Spatial Approach To FPGA Cell Placement By Simulated Annealing," the disclosure of all of which is incorporated herein by reference.

STATEMENT REGARDING FEDERALLY SPONSORED RESEARCH OR DEVELOPMENT

The present invention was made with support from the United States Government under Grant number N00014-01-0651 awarded by the Office of Naval Research of the Department of the Navy, and Grant CCR-0133102 awarded by the National Science Foundation. The United States Government has certain rights in the invention.

BACKGROUND OF THE INVENTION

1. Field of the Invention

The present invention relates to the field of electronic circuit design. More specifically, a method and apparatus for element placement in the context of placement problems for standard or custom cells, field programmable gate arrays (FPGAs), programmable systems on chip (PSoC) or multiprocessors are disclosed.

2. Description of the Prior Art

The most time-consuming operation in the design automation flow from a hardware description language representation of a digital circuit to an FPGA programming bitstream is the placement step. Large designs can have placement runtimes of hours or even days for modern multimillion user-gate devices. Software algorithms and workstation capabilities are not improving fast enough to keep up with the exponentially increasing number of resources available on FPGAs.

Placement is a NP-complete problem. A widely used approach is simulated annealing, as disclosed, for example in S. Kirkpatrick, C. D. Gelatt, and M. P. Vecchi, "Optimization by Simulated Annealing," Science, vol. 220(4598), pp. 671–680, 1983. Another well known approach is the force-directed algorithm disclosed in S. Goto, "An efficient Algorithm for the Two-Dimensional Placement Problem in Electrical Circuit Design," IEEE Transactions on Circuits and Systems, vol. CAS-28, pp. 12–18, 1981. Force-directed algorithms can give acceptable results, but often terminate trapped in local minima.

Most placers are designed to execute on sequential uniprocessors. Within the domain of fast placers, there are three different approaches to the problem. Most commonly, traditional, sequential software is optimized for substantial speed increased. Less commonly, placement software is parallelized over some small number (less than a dozen) of microprocessors. Rarely, approaches to the placement problem are seen that involve a very large number of processing elements.

Parallel approaches are disclosed, for example, in U.S. Pat. No. 5,144,563 to Date et al. and U.S. Pat. No. 5,796,625 to Scepanovic et al.

Prior art schemes attempting to use a very large number of processing elements are the schemes developed by Banerjee, Horrvath, Shankar, Pandya, and Chyan, Breuer.

To accelerate force-directed placement, a scheme to assign one processor element to each cell of an ASIC design is described in P. Banerjee, "Parallel Algorithms for VLSI Computer-Aided Design," Chapter 3, Englewood Cliffs, N.J.: PTR Prentice Hall, 1994, and E. I. Horvath, R. Shankar, and A. S. Pandya, "A Parallel Force Directed Standard Cell Placement Algorithm," Technical Report Dept. Computer Science, Florida Atlantic University, Boca Raton, Fla., 1992. Unfortunately, this design mostly depends on a large-scale supercomputer. D. J. Chyan and M. A. Breuer, in "A Placement Algorithm for Array Processors," presented at the ACM/IEEE Design Automation Conference, Miami Beach, Fla., 1983 envision a force-directed, systolically interconnected placement engine with one processing element per module. However, also the Chyan-Breuer algorithm is trapped in local minima.

Prior art schemes are not able to achieve both high quality and large speedups. The attempts for large speedups with large number of processors fall short in quality and are highly sequentialized by the schemes used to communicate updates among processors. Attempts to achieve high quality with simulated annealing either have limited quality or limited speedup. None of the prior art schemes teaches how to employ large numbers of processors profitably to achieve large speedups, high quality, and avoid performance bottlenecks in communications.

SUMMARY

The present disclosure provides a spatial approach to the simulated annealing solution of the placement problem. According to the present disclosure, hardware can be constructed to mimic the structure of the problem, resulting in a solution to the placement problem that scales with the ability to build larger and larger devices.

According to a first aspect of the present invention, a method of performing placement of a plurality of elements for electronic circuit design is provided, comprising: a) providing a plurality of processing units, each processing unit of the plurality of processing units being able to communicate with one or more neighboring processing units of the plurality of processing units; b) establishing an initial placement for the elements by forming an initial association between each element and a processing unit; c) for each processing unit, in parallel, updating or not updating a list of processing units associated with the elements to be connected with the element associated with that processing unit; d) repeating step c) for a number of times; and e) for each processing unit, in parallel: e1) selecting a pairing processing unit to be paired with the processing unit; and e2) determining whether to exchange, between the processing unit and the pairing processing unit, the elements associated with the processing unit and the pairing processing unit.

According to a second aspect of the present invention, a method for coordinating exchanges among distributed parallel processing units is provided, wherein: each processing unit is locally connected with one or more neighboring processing units; each processing unit is able to be associated with an element, to be ordered according to a predetermined criterion; each processing unit is able to be paired with one of the one or more processing unit to reach a determination on whether to exchange associations with the respective elements between the paired processing units, the determination being in part based on randomness and in part based on a cost function.

According to a third aspect of the present invention, a placement device for performing placement of a plurality of elements for electronic circuit design is provided, comprising a plurality of processing units, wherein: each processing unit of the plurality of processing units is able to communicate with one or more neighboring processing units of the plurality of processing units; each processing unit of the plurality of processing units is able to be associated with one element of the plurality of elements to be placed; each processing unit comprises an exchangeable element connection list of elements to be connected with the element associated with the processing unit and a corresponding updatable processing unit connection list of processing units associated with the elements of the element connection list.

According to a fourth aspect of the present invention, a processing unit for use in a placement device performing placement of a plurality of elements for electronic circuit design is provided, the processing unit being associatable with an element of the plurality of elements and comprising a content addressable memory (CAM), the CAM comprising: a first memory component storing a connection list of elements connected, in the placement, with the element associated with the processing unit; and a plurality of second memory components connected with the first memory component, each second memory component able to store information about one element of the elements of the connection list, wherein the CAM operates according to either: a first mode, where the connection list stored in the first memory component is exchanged with a connection list of another processing unit; or a second mode, where the second memory components are set to store information in accordance with the connection list; or a third mode, where identification information of an element received by the CAM is compared with the information stored in the second memory components, to provide address information of a location storing position information of a processing unit associated with the element whose identification information is received.

According to a fifth aspect of the present invention, a method of performing placement of a plurality of elements for electronic circuit design is provided, comprising: a) providing a plurality of processing units, each unit being able to be associated with one or more of the elements to be placed; b) for each processing unit: b1) selecting a pairing processing unit to be paired with the processing unit; and b2) determining whether to exchange, between the processing unit and the pairing processing unit, the elements associated with the processing unit and the pairing processing unit; and c) for each processing unit, updating a list of processing units associated with the elements to be connected with the one or more elements associated with that processing unit.

According to a sixth aspect of the present invention, a method of performing placement of a plurality of elements is provided, comprising: assigning a potential location to each element; assigning a placement engine to each potential location, whereby each element is assigned to a placement engine; and performing pairing operations between placement engines, wherein, at the end of each pairing operation, association of the elements to the paired placement engines is either exchanged or remains the same.

According to a seventh aspect of the present invention, a method of performing placement of a plurality of elements by means of processing units built out of a plurality of said elements is provided, comprising: grouping elements and configuring the elements to be processing units; combining the elements to be placed in clusters of elements; performing cluster placement on the clusters; and performing element placement on the elements combined in the placed clusters, wherein cluster placement is performed through: assignment of a processing unit to each cluster; pairing operations between processing units, wherein, at the end of each pairing operation, association of the clusters to the paired processing unit is either exchanged or remains the same.

According to an eighth aspect of the present invention, a method of performing placement of elements by means of processing units built out of a plurality of said elements is provided, comprising: performing a first design transformation such that transformed elements to be placed each contain sufficient resources to implement a processing unit; configuring the device as a set of processing units; and performing placement on the transformed elements using said set of processing units.

Advantageously, stochastic swap considerations in accordance with the present invention improve quality, as shown in FIG. 4 and Chapter 6 of provisional application 60/473, 722 incorporated by reference in the present application.

The present disclosure can be advantageously used in applications where the time criminality of the placement problem demands a fast solution, such as reconfigurable computing and logic emulation systems. In particular, physical devices for reconfigurable computing can be directly configured to be a placement engine, without adding additional hardware to the devices. In the case of logic emulation systems, arrays of FPGAs are usually adopted for rapid prototyping. According to the present disclosure, FPGAs can be used for self-placement, allowing a substantial reduction in the placement time when compared with software placement solutions.

BRIEF DESCRIPTION OF THE DRAWINGS

The present invention will be understood and appreciated more fully from the following detailed description taken in conjunction with the drawings in which:

FIGS. 5–7 and 10 show a possible high-level language pseudocode for use with the present disclosure;

FIG. 9 shows a representation of a swap arrangement;

DETAILED DESCRIPTION

Figure 1:
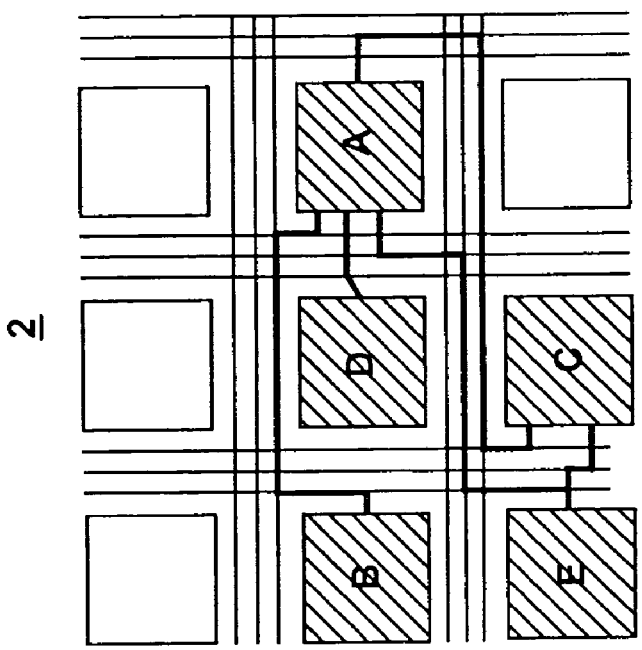
FIG. 1 shows a schematic representation of the placement and routing problems in the design of electronic circuits.
Figure 1:
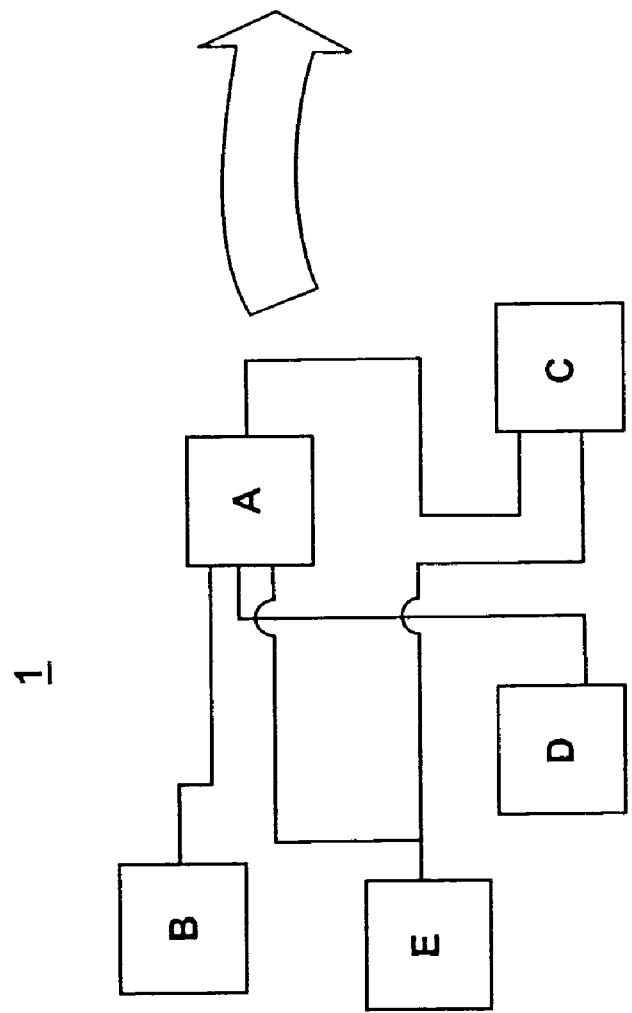

FIG. 1 shows a schematic representation of the placement and routing problems in the design of electronic circuits, where a net list 1, comprising elements A–E and respective connections between those elements, is placed and routed on a field programmable gate array (FPGA) 2. The quality of the placement determines whether it is possible to route the design, what the maximum clock rate will be, and how much power is consumed by the interconnect.

The present invention is directed to a hardware-assisted solution of the placement problem, where the same hardware system on which the elements are to be placed or a separate engine are used to obtain an approximation of the optimal placement. The optimal placement is one of the possible placements that minimizes some cost function over the entire placement. Use of the same hardware system on which the elements are to be placed to solve the placement problem is called self-placement.

Usually, the elements to be placed are some kind of logic blocks (LB). For FPGAs, these LBs are usually look-up tables (LUTs). LUTs are the building blocks of FPGAs. In particular, LUTs are universal function units for some small number, typically four, input variables. They are typically implemented as $2^k \times 1$ memories, where k is the number of inputs. However, the person skilled in the art will understand that the present disclosure can be used with other kinds of LBs, such as general or special purpose processors, ALUs, PLAs, memory blocks, clusters of LUTs (often less than 10), other larger macroblocks such as 20×20 squares of logic, compute pages, or logic blocks which are not completely universal.

Additionally, the present invention can be applied on a heterogeneous substrate, i.e. a substrate having a variety of resources available on it, such as LUTs and multipliers. In such case, several layers of placers according to the present invention can be provided, wherein each layer deals with a particular resource type. An example of heterogeneous substrate is the Xilinx Virtex-II Pro FPGA,—See Xilinx, "Virtex-II Pro Platform FPGAs: Data Sheet," 2003 [retrieved on 2003-08-12]. Retrieved from the Internet: <http://xilinx.com/partinfo/ds083.pdf>

According to the present invention, an engine comprising a plurality of processing units is provided to solve the placement problem. Each element to be placed (e.g. LUT) is assignable to one of the processing units. Thus, there are typically more processing units than elements to be placed. The processing units are preferably arranged as an H×W array of processing units, where the position of the processing unit represents the position of the associated element (e.g. LUT) in a physical placement. Each processing unit is assigned to a potential location and knows its own position. Additionally, each processing unit keeps track of the element assigned thereto and of the list of elements connected with the element assigned to that processing unit. With reference to FIG. 1, for example, five processing units will be assigned to the elements A–E, one for each element. The processing unit associated with element E, for example, will keep track of the element E assigned to that processing unit and of the elements A and C connected with the element E. This connection list can be seen in form of a table stored in the processing unit. The following table shows an example of the connection list present in processing element #1 associated with element E.

| IDENTIFICATION INFORMATION | LOCATION INFORMATION |
|---|---|
| Element E | PE # 1 (here) |
| Element A | PE # 3 |
| Element C | PE # 4 |

Additionally, each processing unit is able to communicate with its neighbors, i.e. its neighboring processing units, and determine whether a swap would locally improve a placement cost. A swap is an exchange of elements and connection lists between processing units. If element E and its connection list are associated with processing unit #1, and element A and its connection list are associated with processing unit #2, a swap between processing unit #1 and processing unit #2 will result in element A and its connection list being associated with processing unit #1 and element E and its connection list being associated with processing unit #2. Placement cost is given by a cost function, to be minimized in accordance with the methods and devices of the present disclosure.

A suitable cost function could be the total Manhattan wirelength of the placement. A Manhattan wirelength is the minimum length of wire required to route from one element to another using strictly horizontal and vertical routing segments and 90° turns. Each processing element assumes that its contribution to the current placement cost is the sum of the Manhattan wirelengths required to route the element associated with that processing unit to the estimated positions of elements connected to the inputs and outputs of that element.

The person skilled in the art will easily recognize that the methods and devices of the present disclosure are applicable to any other cost function, in particular a function that can be computed as the sum of the contributions of the local cost of each of the elements. Alternative cost functions could be any function of wirelength, such as square or weight of the wirelengths, possibly depending on the number of nodes the wires are connected to. Timing optimization could also be provided, for example by assigning higher weights to the wires on the paths with the highest "timing criticality," as also later explained in greater detail.

Figure 2:
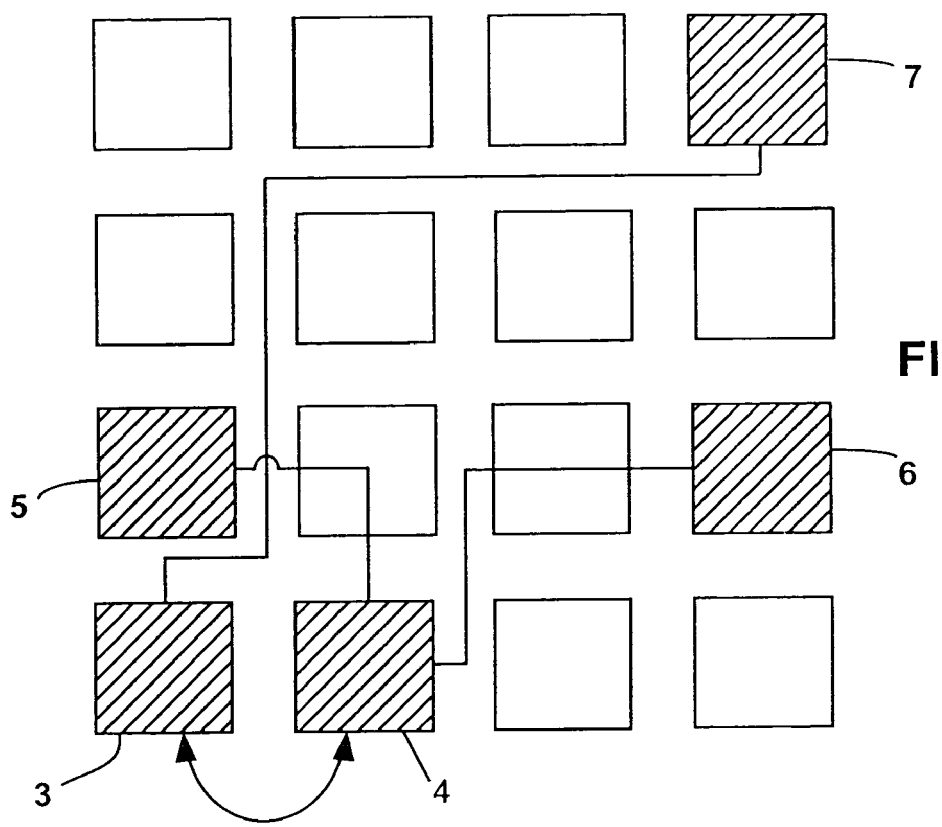
FIGS. 2 and 3 show swap negotiations between processing units.

FIG. 2 shows a negotiation between processing unit 3 and processing unit 4. The element associated with processing unit 4 is connected with the elements associated with processing units 5 and 6. The element associated with processing unit 3 is connected with the element associated with processing unit 7. From the Figure, it can be seen that the sum of the Manhattan wirelengths without the swap is two from 4 to 5, three from 4 to 6, and six from 3 to 7, for a total of eleven, while the sum of the Manhattan wirelengths with the swap gives a total of ten. Therefore, a swap between processing units 3 and 4 is effected, because it improves the Manhattan wirelength placement cost.

Figure 3:
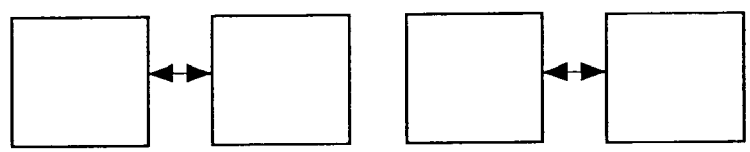
Figure 3:
Figure 3:
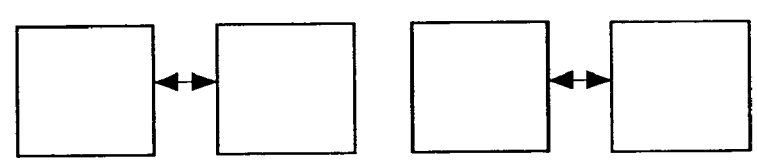
Figure 3:

Each negotiation between neighboring units occurs in parallel. This means that, if the number of processing units is N, N/2 negotiations occur in parallel, as shown in FIG. 3. If a swap between a first processing unit and a second processing unit occurs, the identification and location information table stored in the first processing unit is transferred to the second processing unit and vice versa, as already explained above.

Each time a swap occurs, an element is associated with a new processing unit. This new situation should be communicated to the various processing units, to update the location information of that element, should that element be present in the connectivity list of a particular processing unit. However, a full update of the state of the placement engine every time a group of swaps is considered is likely to be unworkable and unnecessary. Simple update schemes could require O(N) time.

The present invention provides a different and original approach. In particular, a predetermined number of N/2 swaps is performed before the location information of the various elements is updated. Once the predetermined number of N/2 swaps has occurred, the location information of the various elements is updated. The update occurs by one of several schemes, for example a "position update chain" which snakes through the array of processing units, as shown in FIG. 4.

Figure 4:
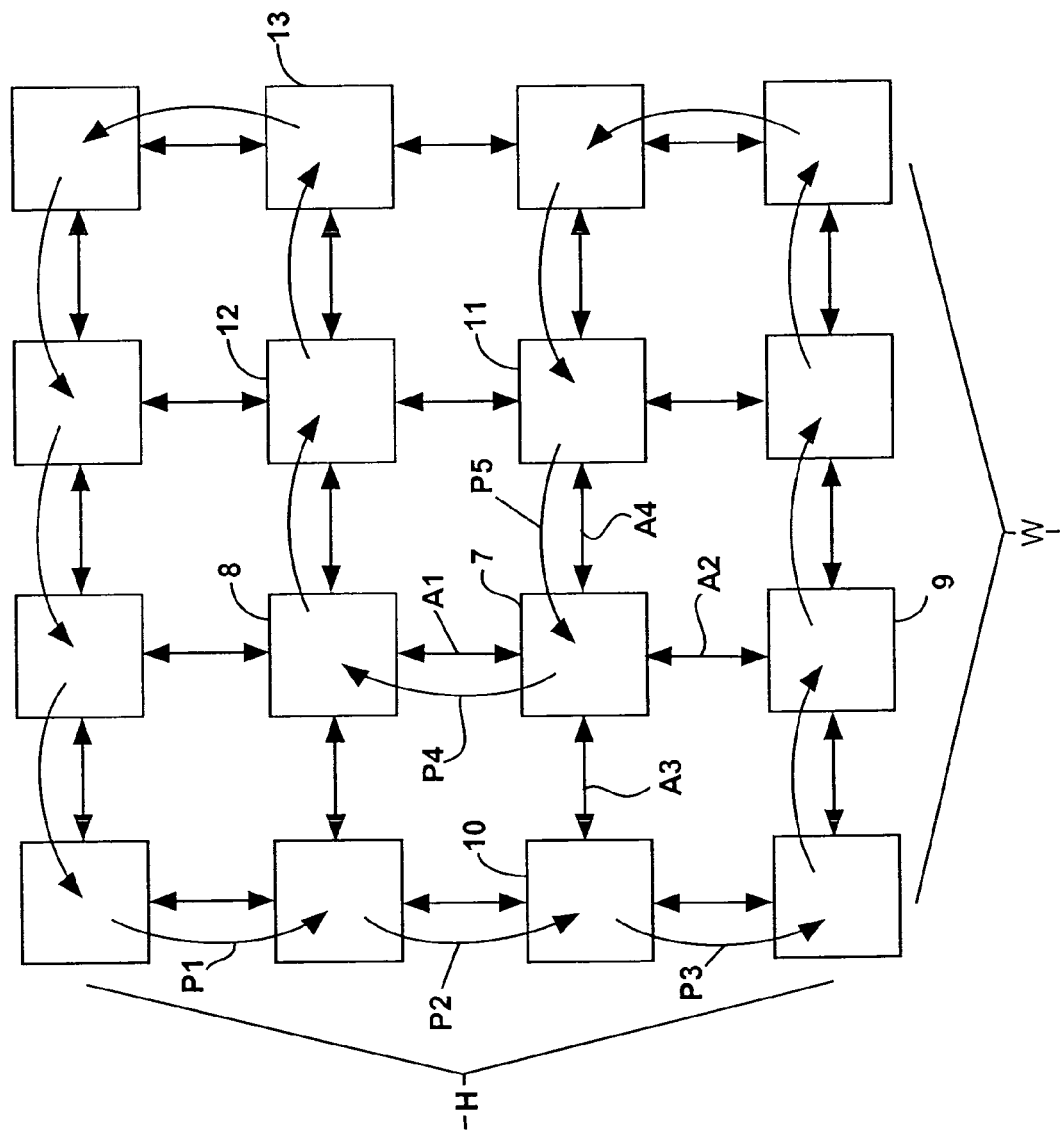
FIG. 4 shows a systolic array of processing units and a position chain.

FIG. 4 shows an array of 4×4 processing units, where each processing unit is able to communicate with one or more neighboring processing units. Engines like this are known in the art as 'systolic' engines. For example, processing unit 7 is able to communicate with its neighboring top processing unit 8, its neighboring bottom processing unit 9, its neighboring left processing unit 10, and its neighboring right processing unit 11, as represented by straight arrows A1, A2, A3 and A4, respectively. As already pointed out before, the present invention advantageously provides for the presence of a position update chain, represented by curved arrows P1, P2, P3. The position update chain allows shifting of the location information of the various elements from one processing unit to the other.

In particular, each time a predetermined number of N/2 parallel swaps has occurred, each processing unit communicates, in parallel, to one of its neighboring processing units, location information and identification information of one of the elements to be placed. The neighboring processing unit to which this information is communicated is selected by means of the position update chain. Therefore, processing unit 7 will communicate location and identification information of one of the elements to processing unit 8 through the connection A1, as shown by curved position arrow P4.

The first time this communication is effected, each processing unit communicates location and identification information of the particular element associated with that processing unit and also receives location and identification information of the element associated with another one of the neighboring processing units. Therefore, in the first communication step, processing unit 7 will communicate information about the element associated with processing unit 7 to processing unit 8 through the connection A1, as shown by curved position arrow P4, and will also receive information from processing unit 11 about the element associated with processing unit 11 through the connection A4, as shown by curved position arrow P5.

The next time the communication is effected, each processing unit communicates location and identification information of the element received in the previous cycle to the same neighboring processing unit to which the previous information was communicated, and, in a similar way, receives information from another one of the neighboring processing units. Therefore, location information and identification information of the element associated with the processing unit 7, for example, is shifted to processing unit 8, processing unit 12, processing unit 12, processing unit 13 and so on, until the information has been communicated to the entire array of processing units. Therefore, assuming that the array contains H×W processing units, a complete cycle will preferably take H×W shifting steps. The processing unit does not need to communicate its location if the location can be determined by the receiving processing unit with a counter.

The position chain is determined at the beginning of the method, and will be designed to allow shifting of information between all processing units. A procedure for obtaining a position chain in a systolic array of H×W elements will be easy to determine for the person skilled in the art and will not be here described in detail. For example, with an even number of rows, the chain could be: (0,0)→(0,1) . . . (0,W−1)→(1,W−1)→ . . . (1,1)→(2,1) . . . (0,H−1)→(0,H−2) . . . (0,0), i.e. serpentining through the array ignoring the first column until the end. With an odd number of rows and an even number of columns, the array could be rotated and the same cycle as described above could be performed.

Alternatively to a position chain shifting approach state updating can be performed by means of a "sorting network", as described, for example in C. D. Thompson, H. T. Kung "Sorting on a Mesh-Connected Parallel Computer," CACM 20 (4): 263–271 (1977). Numerous advances on the basic mesh sorter have been published since Thompson and Kung. Once it is apparent that a mesh sorter is useful in this context, one skilled in the art will know how to adapt a more recent mesh sorter for this application.

When a sorting network is used to propagate state information, the physical position of a processing element (node) can be used as an address. Therefore, messages are sent through the network sorting by this address. This advantageously allows to communicate from all of the nodes to all of the nodes (but every node must receive exactly one message) in only O(sqrt(N)) time instead of O(N) time. A constant number of sorting operations is performed to route data around the array.

In the case of sorting networks, an update scheme works as follows. All elements have "home positions." Some number of swaps are conducted and then a sorting network is used to communicate each of the elements' positions back to their "home" locations. Then, from the home positions, the connected nodes are updated with the new positions. This is done by communicating back to the home positions of the connected nodes. If each element is connected to k other elements, this requires O(k*sqrt(N)) time. In this way, the home positions are provided with the updated information. If some positions are empty, those positions could be configured, before placement begins, with "dummy" destination addresses to guarantee that the connected elements will be reached by the sorting process.

A further alternative for updates is a tree-based update or broadcast scheme, wherein a tree structure, for example a binary tree structure, is built or layered on top of the systolic array.

Providing the tree does not change area or distance requirements except by a constant factor. In particular, long wires in the tree are pipelined so that all connections/clock cycles remain of constant length. The total delay from the leaf to the root of the tree is of O(sqrt(N)) for a two-dimensional mesh, i.e. within a constant factor of the worst-case distance across the placer or placed target design according to the present disclosure.

A feature of a tree-based update broadcast scheme is that updates from a leaf out to all of the leaves (the entire design) can be broadcast in O(worst-case-distance in the network) time, for example O(sqrt(N)) in a two-dimensional placement or O(cube-root(N)) in a three-dimensional placement. This approach is better than a shift-register scheme which has O(N) delay getting data from the leaf node to all nodes.

Although cycling N variable elements from the root to the leaves to perform update of the elements would still take O(N) time, a tree scheme allows some updates to be obtained faster if only some of the O(N) updates are sent along the tree. Additionally, a tree scheme also provides increased flexibility in selecting the order in which data get out, i.e. no longer being tied to a fixed position chain.

It should be noted that with a simple binary tree, both children nodes cannot send an update simultaneously to a parent node. Therefore, a sequentialization is required. For example, higher priority data could be sent first. A different, less expensive, approach provides sending to a parent node only updates from one of the children in case of contemporaneous transmission. The data which is not sent could be discarded. A further refinement provides for a random selection among children data having equal priorities.

A further improvement is that of providing each node of the tree with 'staleness' information, i.e. additional information which allows each node to keep track of the position the same node had when sending the previous value to the broadcast tree. Staleness is preferably defined as a function of the distance between a current position and the last broadcasted position of a node. If staleness information is sent up the tree, the tree can advantageously make sure that the "most stale update" (one update randomly selected from among those with largest staleness) will be the one which makes it to the root of the tree and is broadcast back to all of the leaves.

A further refinement is that of broadcasting some updates only to subtrees, to allow more updates to be sent in some time period, at the cost of not letting every node know about every update. For example, for nodes in the lower-right quadrant of the array it is not important to know where in the upper-left quadrant some connected component is if it remains in that quadrant. However, when a node changes quadrants, then the other node will need more detailed information. Therefore, a scheme can be provided where the position is approximated as the logarithm or floating point of the position, to just keep track of the height in the tree where the nodes differ from each other and only consider changes which are significant enough to change the accuracy of the information kept. In this way, if a node does not change its top level quadrant, its update may only need to be seen by the nodes within its own quadrant. Therefore, when a change is made, the change is sent out the top of the smallest tree that encloses both the before (stale) and after (new) position.

A simple way to achieve this is to use a single tree and divide the arbitrary cycles into a series of one per tree level: first cycle is for tree level 1, second for tree level 2, . . . nth for tree level n, n+1'st for tree level 1, n+2 for tree level 2, . . . ). On the tree "level m" cycles, the stalest element arriving at the root of tree level m is picked and then broadcast to the subtree rooted at tree level m. Each leaf notes when it was last broadcast to tree level m, therefore it knows its staleness with respect to tree level m.

In this way, there is a challenge presented by the fact that the paths have different lengths for the different tree levels. One way to use this fact advantageously is to perform a single up pass of updates which is used for a series of broadcasts back to the subtrees. The last one to be resolved will be the top level and it will then broadcast back down. In this way, at least one update is performed for each of the log(n) tree levels in O(log(n)) time, i.e. one round trip up and down the tree.

Further refinements could provide for the use of different time mixing schemes for the tree levels. If necessary, more than one tree could be used, to increase bandwidth. Additionally, offset, overlapping trees could be used, to avoid worst-case edging effects in the tree. The overlapping trees could be physically distinct and running in parallel, or could use the same hardware with different configurations in a time-multiplexed manner.

A further advantage of the tree scheme is that of allowing timing updates in O(N) time. One should note that wire delay is now a major (often dominant) component of the delay. As components are moved around a wire, delay between them changes. In order for the placement to minimize the wire delay, wire delay should be recomputed in an efficient manner during the placement process. Simply knowing the delay to a predecessor is not sufficient to know the delay for a design. Rather, delay from the start set (inputs and state elements, typically) to a given node and delay from that node to the end set (outputs and state elements, typically) are needed. The information needed to know timing could be obtained by:

a) compute on ASAP (as soon as possible) delay=delay from the start set;

b) compute on ALAP (as late as possible) delay=delay from the end set; and c) compute the slack as difference between the target delay and the sum of the ASAP and ALAP delays of a node.

Nodes with lower slack values are the ones that matter most for timing, so that they must be moved to best decrease the cycle time. The ASAP and the ALAP delay can be computed in a single O(N) pass through updating values using the tree-based broadcast scheme. Each node is set to only send its value into the tree when it has heard the position and ASAP (or ALAP) delay of all its predecessors (successors). Once a node knows the ASAP/ALAP delay and position of its predecessors/successors, it can compute its own ASAP/ALAP. Therefore, each node listens for updates as before. When it satisfies its predecessors/successors, it starts broadcasting its update (position, ASAP, ALAP) into the tree. The node continues to do this until it hears its own update, so it knows that its value has been sent. The tree nodes continue to select randomly among children sent at the same time, in order to avoid sending the same value for O(log(N)) time during the round trip delay for an update to go through the tree. When the last node stops sending its update value, the entire timing is known.

Track of the delays as they go through the root can be kept by means of a controller, so that the controller knows the worst-case delay in the network at a point in time. Use of a controller may be useful for knowing when the algorithm has succeeded in achieving a target delay value and/or for adapting parameterization in the algorithm, such as the rate of change of the random threshold later described. Of course, the nodes of the start set will have no predecessors, so they will send their values immediately during the ASAP calculations. Similarly, the end set has no successors and will start sending immediately in the ALAP computation phase. The simplest use of the resulting slack is to weight links during swapping. Links with low slack should be weighted more strongly in the cost computation than links with high slack.

Different types of cost functions for use with the present method and device have already been mentioned. Another variant to the cost function is to use a bounding box cost function. Bounding box cost functions are disclosed, for example, in V. Betz, J. Rose and A. Marquardt: "Architecture and CAD for Deep-Submicron FPGAs", Kluwer Academic Publishers, 1999.

In accordance with the present invention, a bounding box can be computed with two passes through updates, using any update scheme.

During the first pass, positions are passed as usual. At the end of the first pass, the source node for a net knows the bounding box of the net, but the nodes which simply take that net as input do not know the bounding box. In the second phase, the bounding box position is communicated along with the node position. In this manner, each node will know the position and bounding box of each net to which it is attached.

With the tree-based, priority-based update scheme, staleness and bounding box concepts can be combined in the tree. A node sends out its position, bounding box and staleness, and the node having the higher (stale position, bounding box) pair will win.

In the timing scheme, positions can be propagated with the first pass of timing (e.g. ASAP calculation). At the end of the first pass, all nodes know their own bounding box. During the second pass (e.g. ALAP calculation), bounding boxes are passed. At the end of these two passes both bounding box and timing data are updated.

Each time a processing unit receives location and identification information of an element, that processing unit updates its connection list if that element is present in its connection list. If processing unit 7 is associated with element D, element D being connected with element A, and processing unit 7 receives updated information on element A, processing unit 7 will update its connection list with the new location of element A, i.e. the new processing element to which element A is now associated.

The use of a systolic engine in the method explained above is advantageous. The benefit of "nearest-neighbor" connections is that, for digital circuit implementation, the amount of time spent with information on "wires" between different computations is minimized. Additionally, implementations of a systolic engine are efficient, as wiring requirements are minimized.

As already noted before, a swap occurs if a placement cost, such as the total Manhattan wirelength, is improved. FIG. 5 shows a possible high-level language pseudocode for managing a swap between processing units. If the hypothetical cost after the swap is less than the current cost before the swap, i.e. if the function shown in FIG. 5 returns TRUE, a swap occurs. However, such approach does not guarantee avoidance of local minima, i.e. points which do not correspond to the global solution and where the method can get "trapped." Solutions which are in local minima may often be substantially improved.

In order to avoid getting stuck in local minima, the present invention advantageously provides a stochastic random swap between processing units which allows a swap to be performed independently of a possible improvement in the placement cost. Application of random generators to placement problems are described in the Kirkpatrick paper already discussed in the background section of the present application.

In particular, determination whether to exchange elements between paired processing units is done by means of two separate comparing steps. In the first comparing step, a randomly generated number is compared with a parameter. If the parameter is greater than the randomly generated number, a swap occurs. If not, a second comparing step occurs, where the presence or absence of an improvement in the placement cost is evaluated. If the placement cost improves with the swap, the swap occurs. Otherwise, no swap occurs between the processing units.

FIG. 6 show a possible high-level language pseudocode embodying the above described steps. If the function shown in FIG. 6 returns TRUE, the swap occurs. In order to guarantee convergence of the placement, the parameter is a variable parameter which generally decreases in time. In this way, at the beginning of the method, the occurrence of swaps due to the first comparing step is much greater to the occurrence of swaps due to the second comparing step. However, the more the method proceeds towards a solution, the more swaps due to the second comparing step are generated.

The randomly generated number could be compared before, after, or during the computation of the value of the cost function. Also more complex schemes can be provided. For example, the swap is taken if <cost function improved AND random number within a first range> OR <random number within a second range>.

FIG. 7 shows a possible high-level language pseudocode defining an update function for the variable parameter, where the numeral TOTALINTERVALSTORUN corresponds to the total number of updates of the position of the elements. The inventors have experimentally determined that a preferred way of determining TOTALINTERVALSTORUN when using the sequential shift update scheme is to run for N/20 intervals, where N is the number of processing units. With use of a mesh sorter the number could be, for example, proportional to sqrt(N). With a tree-based scheme, placement and update communications could be advantageously interleaved by doing, for example, a constant number of swaps followed by a constant number of updates.

According to the function of FIG. 7, the parameter varies linearly. Other types of variations can be provided. For example, the parameter can be controlled such that a certain "moves accepted" rate is maintained. Additionally, the parameter can-be controlled such that a stable descent in the cost function is obtained. In both cases, aggregate data from the array will be needed. Those data can be obtained by providing a tree collecting aggregate data from the processing units.

Figure 8:
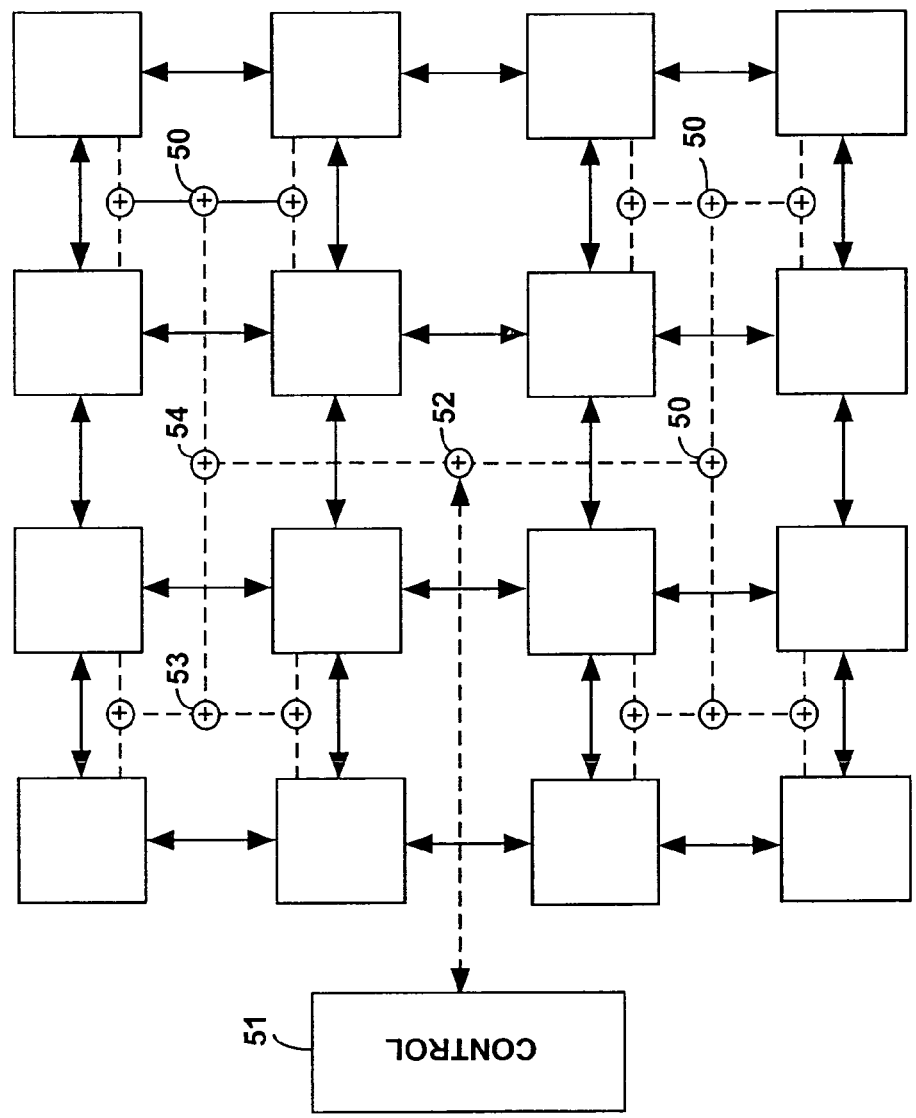
FIG. 8 shows a schematic embodiment of an aggregate data collection structure.

FIG. 8 shows a schematic embodiment of an aggregate data collection structure, showing aggregate data adders 50 exchanging data with a control box 51.

A possible alternative to the scheme of FIG. 8 could provide for the addition of nodes between the adders having a longer distance between them, such as between adders 53 and 54 (one additional node) or between the control box 51 and adder 52 (three additional nodes), to allow transmission of aggregate information between adders/nodes in a single clock cycle. This alternative structure is appropriate as an aggregation mechanism (for computing total placement cost) or a broadcast mechanism for the tree-based update scheme described before.

Local minima could also be avoided by a more complex formulation of the random function, for example a random function which limits the distance an element is allowed to travel.

It should be noted that each processing unit can swap elements with any one of its neighboring units. According to a preferred embodiment of the present invention, the swap negotiation is performed four times for each processing unit, in order to consider all four possible swap directions. Boundary cases, i.e. cases where a processing element does not have a neighboring top, bottom, right or left processing element, can be handled with special cells that never swap off the side of the array.

Figures 9, 10:
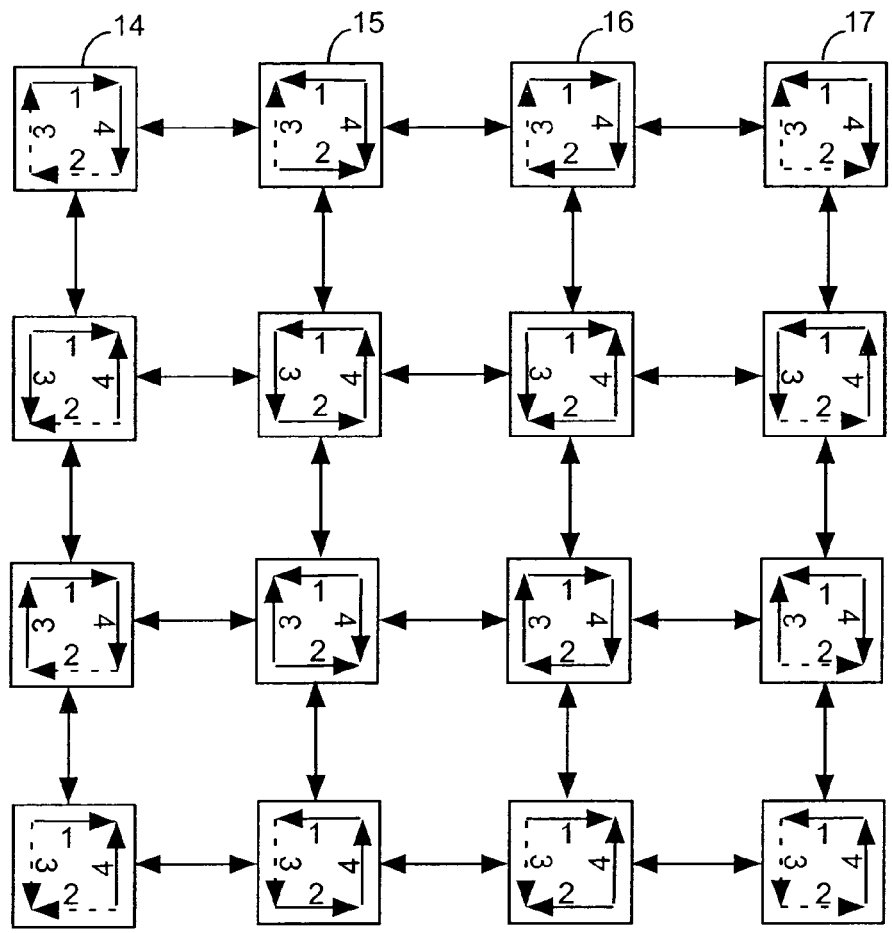

FIG. 9 shows a graphic representation of one of the possible swap arrangements that guarantees all directions are considered. The pairing direction of the first swap phase is represented by arrows numbered with numeral 1. Therefore, in the first swap phase, processing unit 14 is paired with processing unit 15, processing unit 16 is paired with processing unit 17, and so on. The pairing direction of the second swap phase is represented by arrows numbered with numeral 2. Therefore, in the second swap phase, processing unit 15 is paired with processing unit 16, and so on. Similar considerations apply to the third and fourth swap phases. Arrows represented with broken lines indicate boundary cases which are handled with special cells that newer swap off the side of the array, as already disclosed above.

It should be noted that a prior art problem for similar structures was due to the presence of oscillation between swap phases, as explained in the cited Chyan and Breuer reference. The presence invention allows for the gradual removal of oscillations from the algorithm due to the presence of the random comparing step already discussed above and will not introduce periodic oscillation.

FIG. 10 shows a possible high-level language pseudocode embodying the method according to the present invention when using a position chain approach to state updating. The SHIFTOUTCURRENTPOSITION procedure provides the first step of the communication to the neighboring processing units, where location and identification information of the element associated with that unit is shifted to the neighboring processing units in accordance with the position chain. Communication of information about the element received in the previous cycle and update of the connectivity list for each processing unity is made by means of the SHIFTPOSITIONCHAIN and UPDATE procedures, repeated NUMBEROFCELLS times. The swap decisions, repeated four times for each cycle, are made through the SWAPIFAPPROPRIATE procedure. At the end of the method, a possible outcome is that information indicating an optimal placement of the elements is output. However, the solution to the method according to the present invention does not necessarily need to be the optimal one. Additionally, a self-placing FPGA might never output its placement information.

The SWAPIFAPPROPRIATE function can also comprise a single phase which is then changed the next time a SWAPIFAPPROPRIATE is performed. The phases can also occur in random directions once all processing units are provided with an identical source of pseudo-random numbers. A preferred way of determining the swaps per interval is that of performing sqrt (N) swaps in a given interval, where N is the number of processing units in the array. Justification for this is that the cell will travel at most sqrt (N) positions away.

Figure 11:
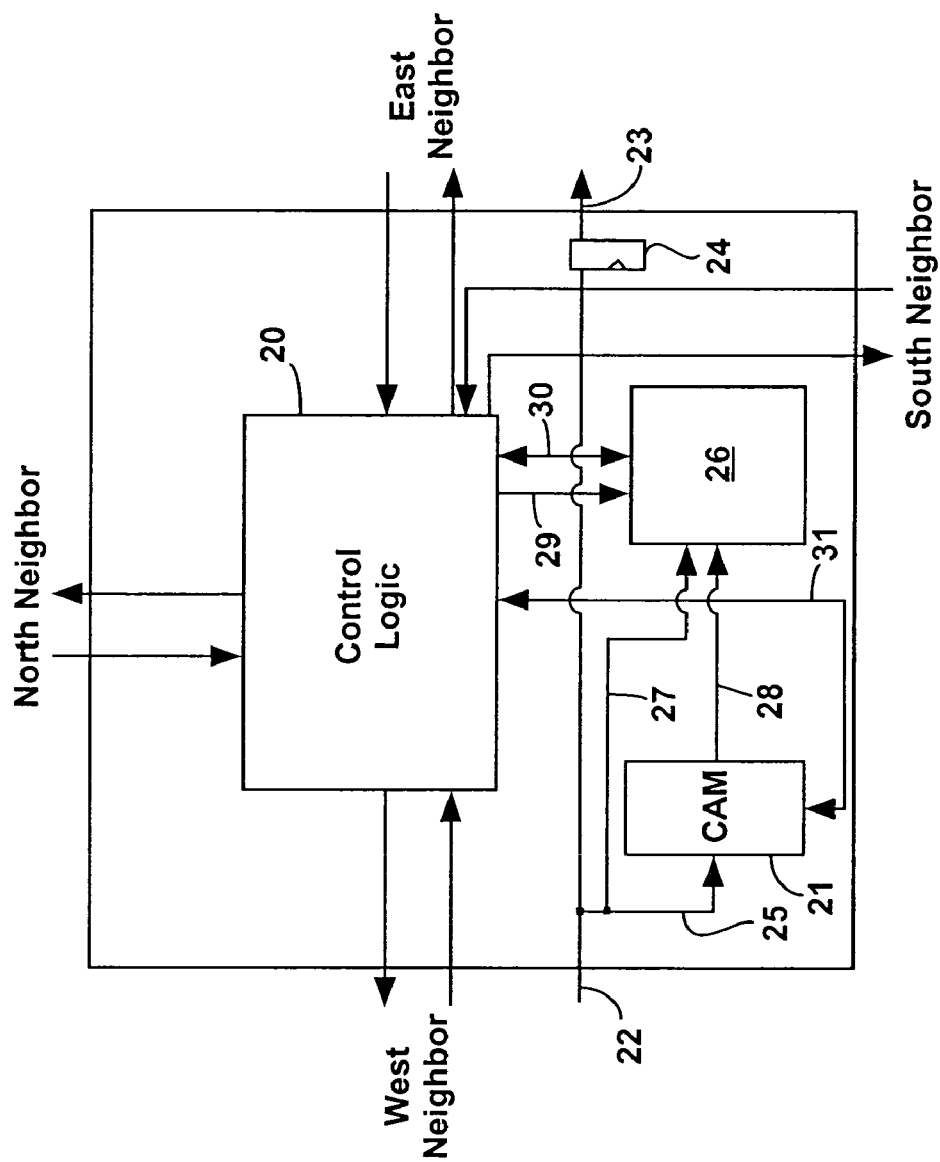
FIG. 11 shows a schematic representation of the internal structure of a processing unit.

FIG. 11 shows a schematic representation of the internal structure of a processing unit. The control logic block 20 includes accumulators and comparators to compute the cost difference that would be associated with swapping a cell. The control logic block 20 also comprises a randomness generator to allow the first comparing step of FIG. 6 to be performed. Communication of the processing element with its neighbors is managed by means of a state machine, also included in the block 20. A content addressable memory (CAM) 21 stores the list of the elements connected to inputs and outputs of the element currently at the processing element's position. Also stored in memory is the ID of the element currently at the processing unit's position.

A randomness generator is well known to the person skilled in the art and will not be described in detail. A random generator for use in an FPGA is a linear-feedback shift register with randomly initialized registers, as described in P. Alfke, "XAPP052: Efficient Shift Registers, LFSR Counters, and Long Pseudo-Random Sequence Generators," Xilinx Application Note, 1996 [retrieved on 2003-08-12]. Retrieved from the Internet: <http://www.xilinx.com/xapp/xapp203.pdf>

Figure 12:
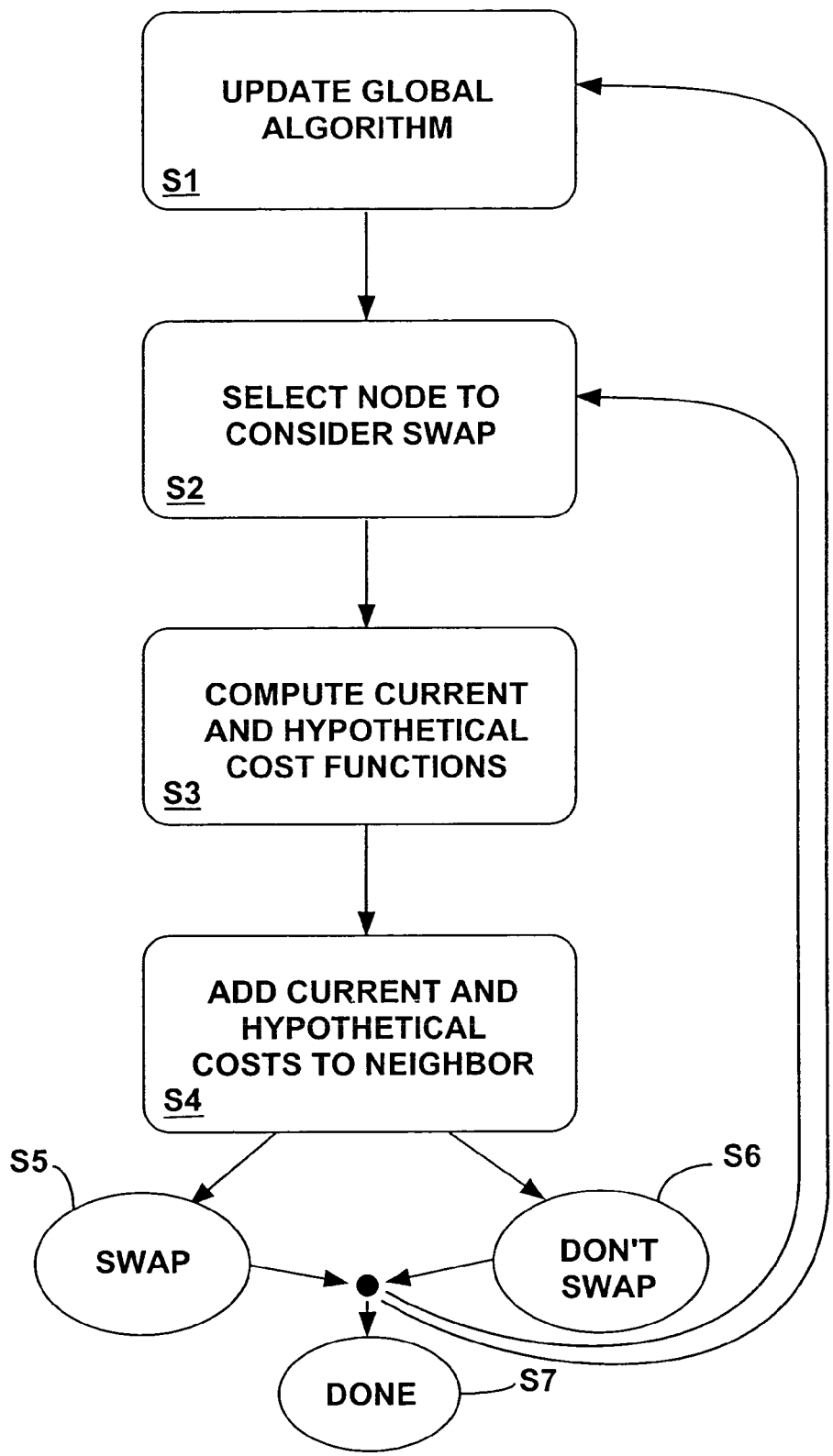
FIG. 12 shows an example of a structure of a content addressable memory for use with the present disclosure.

FIG. 12 shows a possible state machine for use with the present invention, where each processing element can be in one of seven different states: an "Update Global Algorithm" state S1, a "Select Node to Consider Swap" state S2, a "Compute Current and Hypothetical Cost Functions" state S3, an "Add Current and Hypothetical Costs to Neighbor" state S4, a "Swap" state S5, a "Don't Swap" state S6, and a "Done" state S7.

A CAM is accessed by providing content and getting an address back. The address is then used to access another non-CAM memory.

The location and identification information coming from one of the neighboring processing units selected in accordance with the position chain is input into the processing unit from the shift in input connection 22 and output to a different processing unit, also selected in accordance with the position chain, through a shift-out connection by means of a shift register 24. The location and identification information is sent to the CAM 21 through connection 25. If the element associated with that information is present in the connection list stored in the CAM 21, the connection list is updated based on that information. If the element associated with that information is not present in the connection list stored in the CAM 21, no update occurs. The update occurs in a position estimates memory 26. The memory 26 receives position data through connection 27 and an address from the CAM 21 through connection 28. In particular, if an element whose location information is being received is present in the connection list of the element associated with that particular processing unit, the CAM 21 outputs to the connection 28 an address of the memory 26 to be replaced with the new data present on connection 27. The position estimates memory 26 is also addressable by the control logic 20 through connection 29 and bidirectionally exchanges data with the control logic 20 through connection 30.

As already explained above, each time a swap occurs, associated elements and connection lists are exchanged between processing units. The exchange is controlled by the control logic 20, connected to the CAM 21 through a CAM data exchange connection 31.

Quick enumeration through the contents of a CAM is important to efficiently swap connectivity information with neighboring processing units. The CAM has to allow both quick transfers of its contents and fast lookups of data when necessary.

Figure 13:
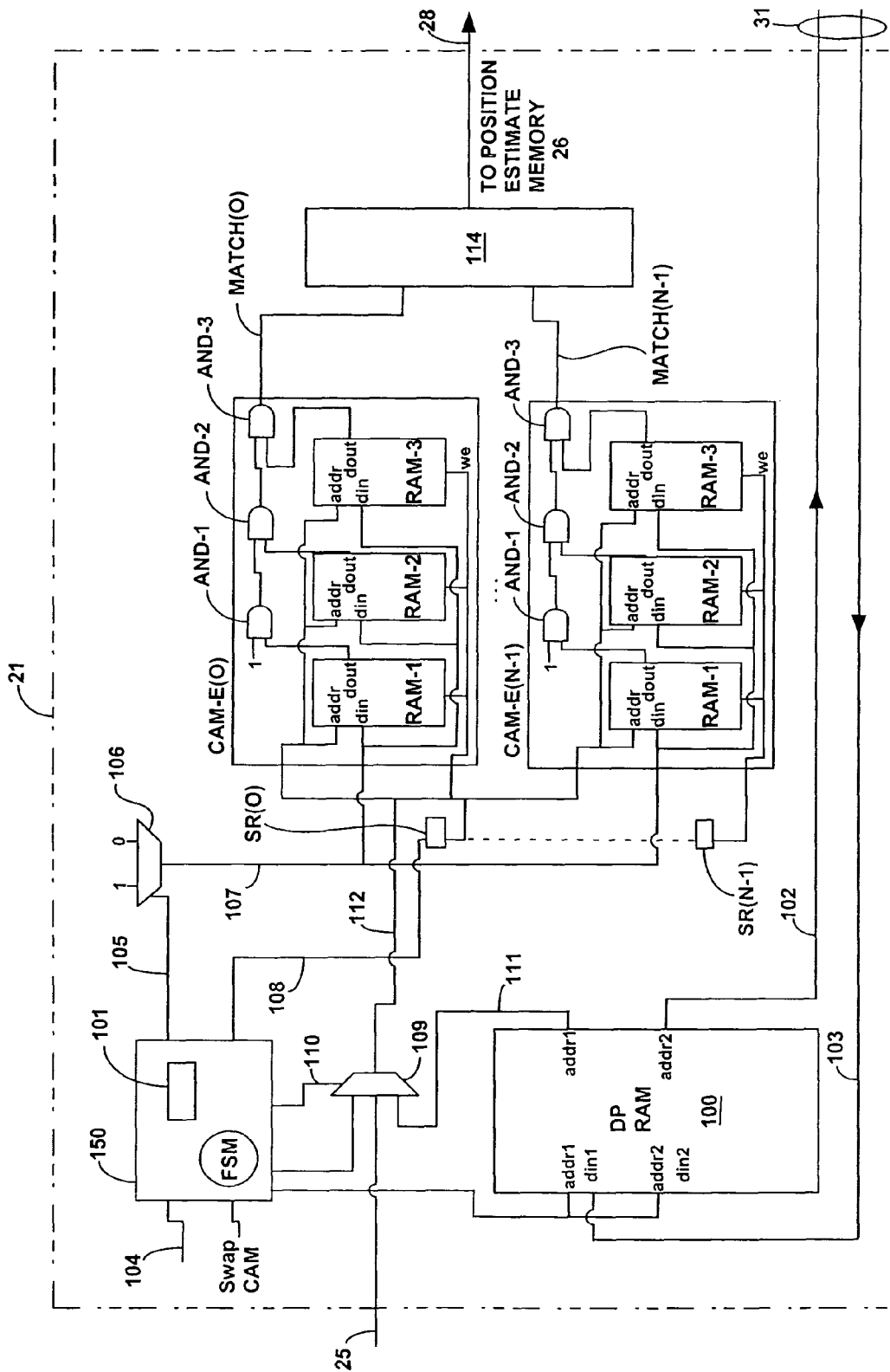
FIG. 13 shows an example of a state machine during operation of the processing units.

FIG. 13 shows an example of a structure of a CAM 21 for use with the present disclosure. The simplified CAM design shown in FIG. 12 allows for data widths (element IDs) of up to 12 bits. The connection list for the element (for example a LUT) currently associated with the particular processing unit containing the CAM 21 is stored in a dual-ported RAM, DPRAM 100 having N addresses, each address pointing to a 12-bit location. DPRAM 100 is designed such that its j-th address represents the j-th branch of the connection list and the 12-bit element ID stored in the j-th location represents the ID of the j-th element present in the connection list of the element currently associated with that particular processing unit. For example, DPRAM[11]=15 means that the 11-th location of the DPRAM 100 contains numeral 15, i.e. that the 11-th element in the connection list of the element associated with that processing unit is element 15. The estimated position of element 15 is contained in the memory 26 of FIG. 11. FIG. 13 shows the design of elements CAM-E(0) . . . CAM-E(N−1) and related circuitry allowing the hookup operation and the exchange operation explained before.

Exchanging CAM Contents

The CAM structure shown in FIG. 13 allows exchange of connection lists. Swapping associations between elements and processing units as shown in FIG. 2 will mean swapping the contents of the DPRAMs 100 of the respective processing units. In particular, a single counter 101 located in a CAM control unit 150 will iterate through the addresses of both ports, delaying the write port by the amount of pipelining registers (present to improve the clock rate, for example) between the two CAMs. During an exchange operation, element IDs will be output through output 102 and input through input 103. Connections 102 and 103 form the bidirectional connection 31 shown in FIG. 11. The CAM components of FIG. 13 are controlled by means of a finite state machine (FSM) present in the control unit 150.

Preparing the CAM for Lookup Operation

Prior to a lookup operation, the contents of a CAM 21 are set, meaning that the connection list present in the DPRAM 100 will set appropriate memory locations in the CAM-E elements. Whenever the position chain is about to be shifted, the CAM control unit 150 triggers a Prep_CAM signal 104 which, in turns, triggers a Load/Clear CAM signal 105 associated with a MUX 106. A '1' load signal is sent to the CAM-E(0) . . . CAM-E(N−1) elements through connection 107. In the present example, each CAM-E element contains three 16×1 RAMs, RAM-1, RAM-2 and RAM-3. The 1 on line 107 will be input into the DIN input of a RAM of a CAM-E element according to the status of a write enable signal WE. In particular, the signal 104 also triggers a Shift_WE signal 108 which sends a single write enable pulse WE down the shift registers SR(0) . . . SR(N−1) controlling the RAMs of each CAM-E.

In this way, the contents of the DPRAM 100 are used to set the CAM-E elements. Let us suppose that DPRAM[9] =3245 =0×CAD. This means that the ninth connection of the element associated with the processing unit of that DPRAM is an element whose ID is 3245 or 0×CAD. Upon receiving the signal 104, the CAM control unit 150 will iterate through the addresses of the DPRAM 100, at the same time iterating the WE pulse until the WE pulse reaches the 16×1 RAMs of CAM-E(9). This will cause a '1' to be loaded into RAM-1 of CAM-E(9) at address 0×C, into RAM-2 of CAM-E(9) at address 0×A, and into RAM-3 of CAM-E(9) at address 0×D, by means of MUX 109, control signal 110 and DOUT1 signal 111 of DPRAM 100, carrying the 0×CAD information, which is then sent along connection 112.

Therefore, each of the CAM-E elements will be set in accordance with the connection list of the DPRAM 100.

Looking Up CAM Contents

When the preparation process is complete, the CAM is ready to map from data (the element IDs) input from connection 25 to addresses of position estimates output along connection 28. When a data value is presented on the input 25, the addresses of all the RAM-1 . . . RAM-3 memories of the CAM-E(0) . . . CAM-E(N−1) are already set, as explained above. Connection 112 will now carry the signal present on connection 25 and will address the locations of the CAM-E(i) corresponding to the signal 25. If the element ID on lines 25 and 112 corresponds to an element in the connection list of the element associated with that processing unit, all three RAMs of one (and only one) of the CAM-E(i) element will return a '1', thus providing a '1' at the MATCH(i) output of the AND-3 port of that CAM-E(i) element. The '1' on the MATCH(i) line will be input to an encoder 114 which will provide an address of the position estimate memory 26 along connection 28. The encoder 114 may be pipelined to obtain a high clock rate.

For example, with reference to the DPRAM[9]=0×CAD information stored in the CAM-E(9) element in the previous operation, and supposing a 0×CAD information is asserted along connection 25, the only CAM-E where the output of AND-3 will be a '1' will be CAM-E(9). In particular, a '1' on the DOUT output of RAM-1 of CAM-E(9) will give a '1' at the output of AND-1 of CAM-E(9), which, combined with the '1' on the DOUT output of RAM-2 of CAM-E(9) will give a '1' at the output of AND-2 of CAM-E(9), which, combined with the '1' on the DOUT of RAM-3 of CAM-E(9) will give a '1' at the output of AND-3 of CAM-E(9), i.e. a '1' on the MATCH[9] line, thus providing an address for memory 26 on line 28.

Resetting the CAM

When the CAM capability is no longer needed, the CAM control logic zeroes out the contents of the RAM-1 . . . 3 memories of the CAM-E elements by triggering again the signal 105 associated with the MUX 106, which signal will now be 0. The resetting operation can be done while swaps are taking place, so there is no overhead for this process.

The person skilled in the art will note that the DPRAM 100 could have been omitted from the design of FIG. 13. However, this would mean that every swap of CAM state would require much more communication. Therefore, the presence of a dual-port RAM in the CAM design is advantageous.

It should also be noted that the CAM implementation of FIG. 13 is efficiently implemented with FPGA LUTs that can be treated as memories. Additionally, it is easy for two CAMs to swap contents.

The physical connections between the elements to be placed according to the method or device of the present invention and the outside pins are sometimes managed by IO pads, as in the case of LUTs.

Figure 14:
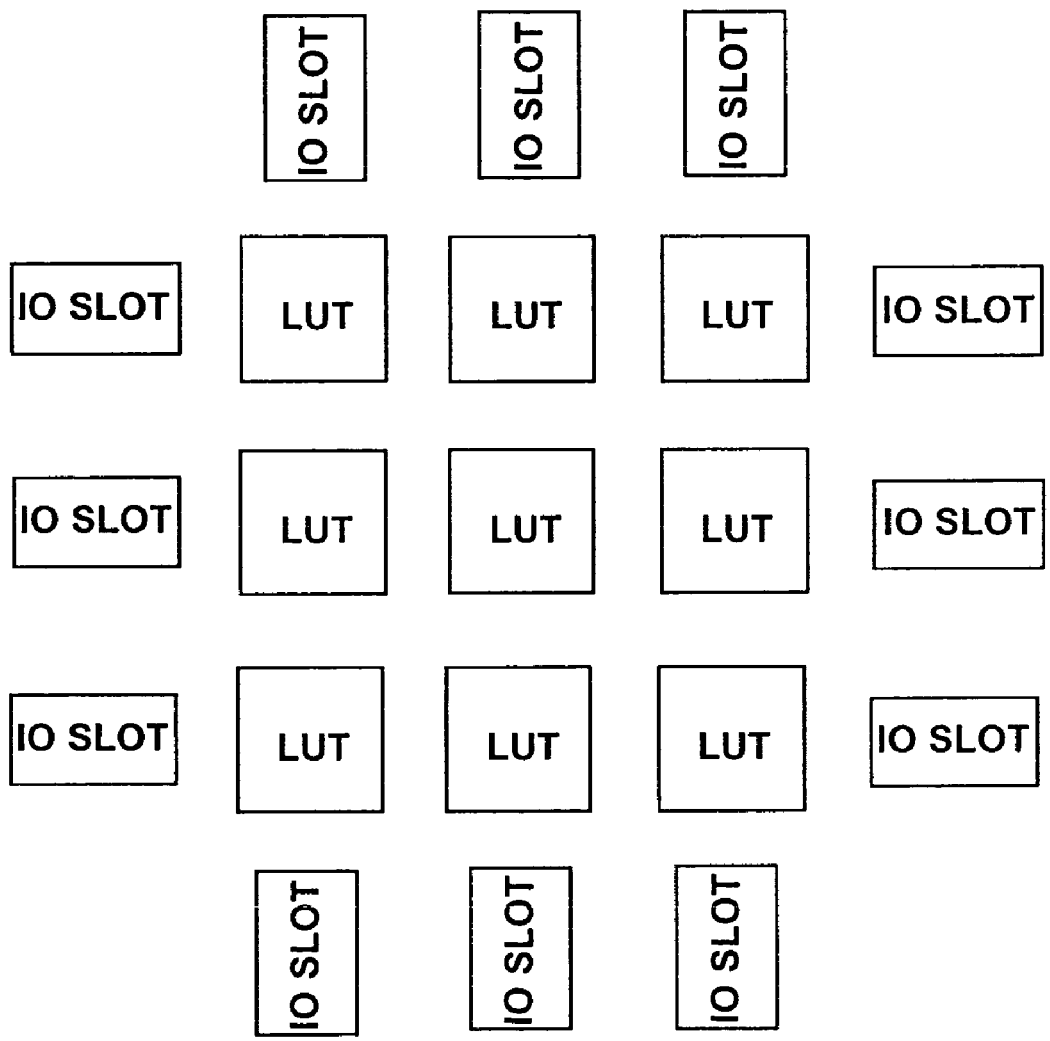
FIG. 14 shows an embodiment where IO slots are provided.

For example, the architecture shown in V. Betz and J. Rose, "VPR: A New Packing, Placement and Routing Tool for FPGA Research," presented at International Workshop on Field Programmable Logic and Applications, London, 1997[Retrieved on 2003-08-12], retrieved from the Internet, http://www.eecg.toronto.edu/~vaughn/papers/fp197.pdf, has some number of IO pads along each side of the chip at the ends of every row and column of LUTs, as shown in FIG. 14. In one embodiment of the present invention, also placement of the IO pads is carried out. In particular, systolic placement is performed on the LUTs themselves, and then a greedy algorithm is used to place the IO pads. An example of greedy algorithm is as follows. Each LUT is initially placed into a SLOT closest to the LUT to which it is connected. For example, a LUT located at (3,6) on a 10×10 array would have its output placed on the left side of the chip six places from the bottom, if a space were available at that group of pins. If such a space is not available, the amount of error is iteratively increased from this "ideal" position until all IOs have been placed. For example, if the LUT at (3,6) could not have its output placed on the left at position six, the next iteration through the loop would attempt to place it on the left side at either position five or seven. Another approach is to place the IO pads along with the LUTs. Then, as the placement method progresses, give the pads a synthetic force (i.e. inclusion of a distance to the nearest side of the chip and incrementally increase the weight of that distance) towards the side of the chip to which they are closest. Finally, use a greedy algorithm to assign them to IO slots. This approach allows a simple hardware implementation.

Alternatively, placement of the elements and the IO pads can be effected by several layers of placers, a first layer dealing with the LUTs and a second layer dealing with the IO pads.

In the multilayer scheme, a locally connected systolic structure is built for each of the types of physical resources (e.g. LUTs, IOs, multipliers, memory blocks, etc.) which exist in the device. This is reflected in a connected systolic graph to hold the LUTs, a connected systolic graph to hold the IOs, a connected systolic graph to hold the multipliers, and so on. When the problem is a 2-dimensional layout problem, as is typical for VLSI components, each systolic graph can be thought of as a plane, the planes being stacked or layered on top of each other. Swapping occurs within each plane as in the base method. However, in general, the placement of all elements depends on the location of all other elements, including the elements of different resource types. Therefore, each physical placement unit keeps track of the location of all of the connected elements, including those of a different physical type. Therefore, a LUT will keep track of all of the IOs it is connected to as well as all of the LUTs it is connected to. When a node computes its cost, that cost will be based both on the cost of the connections to components of the same type and to components of different types. Since all nodes of all types need to know where their connected components go, updates are communicated among all the physical resource types, not just among the homogeneous planes. The person skilled in the art will also note that all the variations and refinements previously mentioned, such as mesh sorting, partitioned tree update schemes and so on, can be applied advantageously to the update problem for this multilayer systolic graph set.

The present invention also provides for embodiments in the case of large designs, where it is impractical to construct an array large enough to hold all of the elements.

Figure 15:
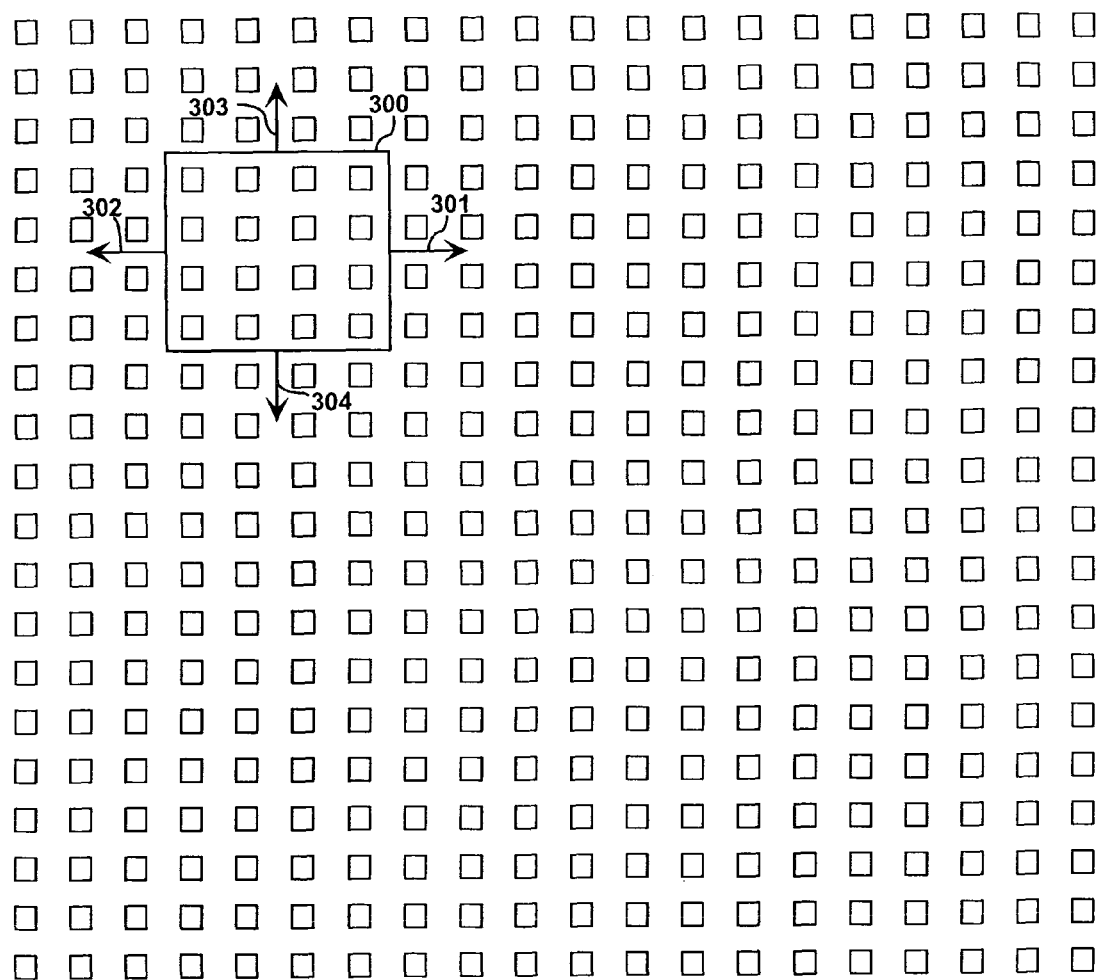
FIG. 15 shows an embodiment where windowing is performed.

A first embodiment uses a "windowing" approach, as shown in FIG. 15, where placement has to be performed on a design of 20×20 elements, when only an array of 4×4 processing units is available. The windowing approach provides for movement of a window 300 across the design. In particular, a move could be either a horizontal move (arrows 301 or 302) or a vertical move (arrows 303 or 304). In particular, each time the nodes move, they stop considering the elements along one of their edges and add the elements along the opposing edge. The edge processing elements are responsible for communicating the updated information to a memory when the elements are removed from the window. The edge processing elements also bring in new information on elements which enter the region being processed.

A second embodiment uses a "folding" approach, where each processing unit is associated to more than one element. Once placement ends, the elements assigned to a particular processing unit can be arbitrarily assigned. Assuming, for example, that four elements are associated to each processing unit, the elements associated with the processing unit at (1,1) can be assigned to (1,1), (1,2), (2,1) and (2,2), while the elements associated with the processing unit at (2,2) can be assigned to (3,3), (3,4), (4,3), and (4,4) and so on.

Alternately, the processing unit can keep track of the multiple physical locations that it represents so that it does swap things into their final position. In addition to the external/neighbor swapping phases, an internal swapping phase can be added, in which the processing unit considers swaps among the cells that are associated with it. Also other optimization steps for the cells associated with it are possible.

The method described in the present disclosure is also suitable for self-placement. Devices can place themselves if the units of placement are powerful enough to implement an entire processing unit. For example, this would be the case when pages (collections of LUTs) are provided for computation as in a reconfigurable computing system such as SCORE. For a description of SCORE, see E. Caspi, M. Chu, R. Huang, J. Yeh, Y. Markovskiy, J. Wawrzynek, and A. DeHon, "Stream Computations Organized for Reconfigurable Execution (SCORE): Introduction and Tutorial," 2000 [retrieved on 2003-08-14]. Retrieved from the Internet: <http://brass.cs.berkeley.edu/documents/score_tutorial.pdf>. Further, if there are more pages in such as system than there are LUTs in a single page, the reconfigurable computing system can place the entire circuit by placing the LUTs on each of the pages sequentially and then placing the pages themselves.

The method according to the present disclosure is suitable where self-placement has to be performed on a fine-grained or dense device, i.e. a device having a very high number of small logic blocks. According to a preferred embodiment of the method, placement then occurs in four steps:

(1) Grouping sufficient logic blocks together to implement the processing element described throughout this disclosure;
(2) Grouping the elements to be placed into clusters that contain no more logic blocks than the number of logic blocks needed to implement the placement engine;
(3) Placing the clusters of logic blocks to be placed using the processing elements or engines composed from logic blocks;
(4) Performing relative logic block placement using the same placement engine built from processing units, which are in turn each built from a group of logic blocks as defined in step 1.

Therefore, placement according to the method occurs in two phases, one time during the third step and another time during the fourth step.

The present disclosure also relates to a method and a device for performing placement of a plurality of elements for circuit design. A potential location is assigned to each element and a placement engine is assigned to each potential location. Pairing operations are performed, in parallel, between placement engines to determine whether to perform exchange of the elements associated with the engines. Exchange determination is based both on a cost function and on randomness considerations. Also self-placement is allowed, where the placement engines are implemented on the same hardware system on which the elements are to be placed.

While several illustrative embodiments of the invention have been shown and described in the above description, numerous variations and alternative embodiments will occur to those skilled in the art. Such variations and alternative embodiments are contemplated, and can be made without departing from the scope of the invention as defined in the appended claims.

The invention claimed is:

1. A method of performing placement of a plurality of elements for electronic circuit design, comprising:
   a) providing a plurality of processing units, each processing unit of the plurality of processing units being able to communicate with one or more neighboring processing units of the plurality of processing units;
   b) establishing an initial placement for the elements by forming an initial association between each element and a processing unit;
   c) for each processing unit, in parallel, updating or not updating a list of processing units associated with the elements to be connected with the element associated with that processing unit;
   d) repeating step c) for a number of times; and
   e) for each processing unit, in parallel:
      e1) selecting a pairing processing unit to be paired with the processing unit; and
      e2) determining whether to exchange, between the processing unit and the pairing processing unit, the elements associated with the processing unit and the pairing processing unit.

2. The method of claim 1, wherein step e2) is a function of randomness and expected improvement of a cost function.

3. The method of claim 2, wherein step e2) is a combination of a comparison between a randomly generated number and a parameter and a comparison of a value of a cost function after the exchange with a value of the cost function before the exchange.

4. The method of claim 3, wherein step e2) is performed by means of a first comparing step where a randomly generated number is compared with a parameter and, in case the first comparing step is not satisfied, by means a second comparing step where a value of a cost function after the exchange is compared with a value of the cost function before the exchange.

5. The method of claim 4, wherein the parameter is a variable parameter that changes over time.

6. The method of claim 5, wherein the parameter decreases linearly over time.

7. The method of claim 2, wherein the cost function is a bounding box.

8. The method of claim 1, wherein the processing units are disposed as a systolic array.

9. The method of claim 8, wherein a combination of steps e1) and e2) is performed up to four times, to pair each processing unit with all neighboring processing units able to communicate with that processing unit.

10. The method of claim 8, wherein the method is performed on a systolically connected array of FPGAs.

11. The method of claim 1, wherein the method is performed on a field programmable gate array (FPGA).

12. The method of claim 1, wherein the initial placement is established in a random manner.

13. The method of claim 1, wherein, in step e1), the pairing processing unit is selected among the one or more neighboring processing units.

14. The method of claim 1, wherein step c) is repeated for a number of times equal to the number of processing units.

15. The method of claim 1, further comprising a step of outputting information indicating an optimal placement of said elements.

16. The method of claim 15, wherein the optimal element placement information is used to perform element placement on a field programmable gate array (FPGA).

17. The method of claim 1, wherein step c) further comprises the steps:
   c1) communicating location information and identification information of an element to one of the one or more neighboring processing units; and
   c2) receiving location information and identification information of an element from a different one of the one or more neighboring processing units,
and wherein updating or not updating the list of processing units associated with the elements to be connected with the element associated with that processing unit is based on the information received in step c2).

18. The method of claim 1, further comprising a step of providing each processing unit with an initial list of elements to be connected with the element associated with that processing unit.

19. The method of claim 1, further comprising the steps:
   f) repeating steps e1) and e2) for a number of times; and
   g) repeating steps c) through f) for a number of times.

20. The method of claim 1, wherein step c) is performed by means of a position update chain.

21. The method of claim 1, wherein step c) is performed by means of a tree-based update.

22. The method of claim 21, wherein the tree is a binary tree, and wherein a sequentialization procedure is provided to manage contemporaneous transmission of two children nodes of the tree to their parent node.

23. The method of claim 21, wherein the tree is a binary tree, and wherein an elimination procedure is provided to select among contemporaneous transmission of two children nodes of the tree to their parent node.

24. The method of claim 21, wherein each node of the tree is provided with staleness information.

25. The method of claim 21, wherein subtrees are used to perform a partial update procedure.

26. The method of claim 1, wherein step c) comprises providing timing information.

27. The method of claim 26, wherein update information and timing information are simultaneously provided to the processing units.

28. The method of claim 1, wherein the processing units are implemented on the same circuit on which the elements are to be placed.

29. The method of claim 1, wherein the method is executed on a reconfigurable substrate and the resultant placement is used to configure placement information for said reconfigurable substrate.

30. A method of performing placement of a plurality of elements for electronic circuit design, comprising:
   a) providing a plurality of processing units, each unit being able to be associated with one or more of the elements to be placed;
   b) for each processing unit:
      b1) selecting a pairing processing unit to be paired with the processing unit; and
      b2) determining whether to exchange, between the processing unit and the pairing processing unit, the elements associated with the processing unit and the pairing processing unit; and
   c) for each processing unit, updating a list of processing units associated with the elements to be connected with the one or more elements associated with that processing unit.

31. The method of claim 30, wherein step b) is performed in parallel.

32. The method of claim 30, wherein step c) is performed by means of a sorting network.

33. The method of claim 32, wherein each processing unit has a position and, in case of empty positions, the empty positions are provided with dummy destination addresses.

34. The method of claim 30, wherein IO pads are associated with the elements, and placement of the IO pads is also performed.

35. The method of claim 34, wherein placement of the elements is performed before placement of the IO pads.

36. The method of claim 35, wherein placement of the IO pads is performed by means of a greedy algorithm.

37. The method of claim 30, wherein the number of processing units provided is inferior to the number of elements to be placed, and wherein placement is performed by means of a windowing approach.

38. The method of claim 30, wherein the number of processing units provided is inferior to the number of elements to be placed, and wherein placement is performed by means of a folding approach, wherein each processing unit is able to be associated with more than one element.

* * * * *